United States Patent
Hegde et al.

(10) Patent No.: US 9,728,502 B2
(45) Date of Patent: Aug. 8, 2017

(54) METAL OXYSILICATE DIFFUSION BARRIERS FOR DAMASCENE METALLIZATION WITH LOW RC DELAYS AND METHODS FOR FORMING THE SAME

(71) Applicant: Samsung Electronics Co., Ltd., Suwon-si, Gyeonggi-do (KR)

(72) Inventors: Ganesh Hegde, Austin, TX (US); Mark Rodder, Dallas, TX (US); Rwik Sengupta, Austin, TX (US); Chris Bowen, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/920,867

(22) Filed: Oct. 22, 2015

(65) Prior Publication Data

US 2016/0133513 A1 May 12, 2016

Related U.S. Application Data

(60) Provisional application No. 62/077,855, filed on Nov. 10, 2014.

(51) Int. Cl.
*H01L 21/768* (2006.01)
*H01L 23/532* (2006.01)

(52) U.S. Cl.
CPC .. *H01L 23/53238* (2013.01); *H01L 21/76831* (2013.01); *H01L 21/76843* (2013.01);
(Continued)

(58) Field of Classification Search
CPC ......... H01L 21/76871; H01L 21/76864; H01L 21/76873; H01L 21/76843;
(Continued)

(56) References Cited

U.S. PATENT DOCUMENTS 7,682,966 B1 * 3/2010 Rozbicki .............. C23C 14/046
257/E21.169
8,035,230 B2 10/2011 Arakawa
(Continued)

FOREIGN PATENT DOCUMENTS

JP 2007-287916 * 11/2007 ......... H01L 21/3205

OTHER PUBLICATIONS

Translation of JP2007-287816 (Ooka et al ) Nov. 1, 2007, 21 pages.*

*Primary Examiner* — Caridad Everhart
(74) *Attorney, Agent, or Firm* — Renaissance IP Law Group LLP (57) ABSTRACT

A method is disclosed to form a metal-oxysilicate diffusion barrier for a damascene metallization. A trench is formed in an Inter Layer Dielectric (ILD) material. An oxysilicate formation-enhancement layer comprising silicon, carbon, oxygen, a constituent component of the ILD, or a combination thereof, is formed in the trench. A barrier seed layer is formed on the oxysilicate formation-enhancement layer comprising an elemental metal selected from a first group of elemental metals in combination with an elemental metal selected from a second group of elemental metals. An elemental metal in the second group is immiscible in copper or an alloy thereof, has a diffusion constant greater than a self-diffusion of copper or an alloy thereof; does not reducing silicon-oxygen bonds during oxysilicate formation; and promotes adhesion of copper or an alloy of copper to the metal-oxysilicate barrier diffusion layer. The structure is then annealed to form a metal-oxysilicate diffusion barrier.

6 Claims, 5 Drawing Sheets (52) U.S. Cl.
CPC .. *H01L 21/76855* (2013.01); *H01L 21/76873* (2013.01); *H01L 2221/1089* (2013.01)

(58) Field of Classification Search
CPC ......... H01L 21/76855; H01L 21/76831; H01L 23/53238; H01L 21/2855; H01L 21/76858
USPC ....................................................... 438/628
See application file for complete search history.

(56) References Cited

U.S. PATENT DOCUMENTS

| | | | |
|---|---|---|---|
| 8,580,688 B2 | 11/2013 | Koike et al. | |
| 2008/0054467 A1* | 3/2008 | Ohba | ................ H01L 21/76826 257/751 |
| 2008/0280151 A1* | 11/2008 | Jourdan | ............ H01L 21/76831 428/450 |
| 2014/0299988 A1 | 10/2014 | Cabral, Jr. et al. | |
| 2015/0021775 A1* | 1/2015 | Matsumoto | ....... H01L 21/76826 257/751 |

* cited by examiner

METAL OXYSILICATE DIFFUSION BARRIERS FOR DAMASCENE METALLIZATION WITH LOW RC DELAYS AND METHODS FOR FORMING THE SAME

CROSS-REFERENCE TO RELATED APPLICATION

This application claims priority under 35 U.S.C. §120 to U.S. Provisional Patent Application Ser. No. 62/077,855 filed on Nov. 10, 2014, the contents of which are incorporated by reference in their entirety herein.

BACKGROUND

Damascene copper (Cu) metallization is the current interconnect metallization of choice for 20, 14 and 10 nm technology nodes and is likely to be method of choice for future 7, 5 and 3 nm nodes as well because copper has a lower resistivity in comparison to other low-cost alternative materials, such as aluminum (Al). A copper damascene process relies on a diffusion barrier to prevent copper from diffusing into an Inter Layer Dielectric (ILD). The diffusion barrier is commonly formed by deposition of either a refractory metal, such as titanium (Ti) or tantalum (Ta), or one or more metal nitride layers, such as tantalum nitride (TaN) or titanium silicon nitride (TiSiN) or similar compounds. Copper cannot diffuse through the barrier, and the metals forming the barrier do not diffuse into the ILD. While diffusion barriers formed by deposition are successful in keeping copper from diffusing into an ILD, the diffusion barriers also reduce the amount of copper that would be present in the cross section of an interconnect line or a via if no barrier was present.

Additionally, a metal liner is used to promote adhesion between copper and the diffusion barrier. Accordingly, to prevent copper diffusion into an ILD and to promote copper adhesion, diffusion barriers and metal liners must have a minimum thickness, which causes a further net reduction in copper cross-sectional area and an increase in the overall resistivity of interconnect lines and vias.

A conventional Self-Formed Diffusion Barrier (SFB) of manganese-oxysilicate provides an attractive solution to the net reduction in copper cross-sectional area as interconnect pitch scaling reduces overall line and via width. One conventional technique for forming an SFB involves deposition of a copper-manganese (Cu—Mn) alloy directly on an ILD or on a liner formed from a metal, such as cobalt (Co), instead of depositing a diffusion barrier directly on the ILD. The deposited Cu—Mn alloy is then annealed at approximately 450 C and Mn diffuses into the ILD. The Mn bonds with oxygen (O) without reducing silicon-oxygen (Si—O) bonds and a barrier layer of Mn-oxysilicate is formed that prevents diffusion of Cu atoms into the ILD. The k-value of the resultant SFB Mn-oxysilicate depends on the stoichiometry of the barrier seed and the amount of time annealed, and the thickness of the Mn-oxysilicate can be controlled by controlling annealing conditions so that the overall value of k for the ILD is not degraded significantly.

As interconnect pitch scales smaller, the copper cross-sectional area of an interconnect line further decreases and reduces overall line width. The metal half-pitch requirements are often met by scaling the amount of copper present along the width of an interconnect at a first scaling rate while the barrier plus liner width is scaled at a second, lesser scaling rate, which further results in a net reduction in copper cross-sectional area.

SUMMARY

Exemplary embodiments disclosed herein provide a method to form a metal-oxysilicate diffusion barrier, the method comprising: forming at least one trench structure in an Inter Layer Dielectric (ILD) material, the at least one trench structure comprising at least one sidewall surface and a bottom surface; forming an oxysilicate formation-enhancement layer on the at least one sidewall surface and the bottom surface of the at least one trench structure, the oxysilicate formation-enhancement layer comprising silicon, carbon, oxygen, a constituent component of the ILD, or a combination thereof; forming a barrier seed layer on the oxysilicate formation-enhancement layer; and annealing the at least one trench structure, the oxysilicate formation-enhancement layer and the barrier seed layer to form a metal-oxysilicate diffusion barrier layer.

Exemplary embodiments disclosed herein provide a method to form a self-formed diffusion barrier, the method comprising: forming at least one trench structure in an Inter Layer Dielectric (ILD) material, the at least one trench structure comprising at least one sidewall surface and a bottom surface; forming a self-formed diffusion barrier (SFB) on the at least one sidewall and the bottom surface of the at least one trench by: forming an oxysilicate formation-enhancement layer on the at least one sidewall surface and the bottom surface of the at least one trench structure; forming a barrier seed layer on the oxysilicate formation-enhancement layer; and annealing the at least one trench structure, the oxysilicate formation-enhancement layer and the barrier seed layer to form the SFB; forming a seed layer of a conductive material on the SFB; and forming a layer of the conductive material on the seed layer of the conductive material by electrodeposition.

Exemplary embodiments disclosed herein provide a method to form a metal-oxysilicate diffusion barrier, the method comprising: forming at least one trench structure in an Inter Layer Dielectric (ILD) material, the at least one trench structure comprising at least one sidewall surface and a bottom surface; forming an oxysilicate formation-enhancement layer on the at least one sidewall surface and the bottom surface of the at least one trench structure; forming a barrier seed layer on the oxysilicate formation-enhancement layer, the barrier seed layer comprising an elemental metal selected from a first group of elemental metals or one or more alloys formed from an elemental metal selected from the first group of elemental metals in combination with an elemental metal selected from a second group of elemental metals or one or more alloys formed from an elemental metal selected from the second group of elemental metals, and an elemental metal in the second group of elemental metals being immiscible in copper or an alloy of copper, having a diffusion constant that is greater than a self-diffusion of copper or an alloy of copper; not reducing silicon-oxygen bonds during oxysilicate formation; and promoting adhesion of copper or an alloy of copper to the metal-oxysilicate barrier diffusion layer; and annealing the at least one trench structure, the oxysilicate formation-enhancement layer and the barrier seed layer to form a metal-oxysilicate diffusion barrier layer.

BRIEF DESCRIPTION OF THE DRAWINGS

Example embodiments will be more clearly understood from the following detailed description taken in conjunction with the accompanying drawings. The Figures represent non-limiting, example embodiments as described herein.

DESCRIPTION OF EMBODIMENTS

The subject matter disclosed herein relates to a technique that utilizes an oxysilicate formation-enhancement layer that facilitates formation of a self-formed diffusion barrier (SFB) in a low-k Inter Layer Dielectric (ILD) for damascene metalization.

Various exemplary embodiments will be described more fully hereinafter with reference to the accompanying drawings, in which some exemplary embodiments are shown. As used herein, the word "exemplary" means "serving as an example, instance, or illustration." Any embodiment described herein as "exemplary" is not to be construed as necessarily preferred or advantageous over other embodiments. The subject matter disclosed herein may, however, be embodied in many different forms and should not be construed as limited to the exemplary embodiments set forth herein. Rather, the exemplary embodiments are provided so that this description will be thorough and complete, and will fully convey the scope of the claimed subject matter to those skilled in the art. In the drawings, the sizes and relative sizes of layers and regions may be exaggerated for clarity.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein relates to a technique that utilizes an oxysilicate formation-enhancement layer that facilitates formation of a self-formed diffusion barrier (SFB) in a low-k Inter Layer Dielectric (ILD) for damascene metalization. Embodiments disclosed herein provide an oxysilicate formation-enhancement layer that comprises high concentrations of Si atoms or high concentrations of Si and O atoms that are used to form a metal-oxysilicate diffusion barrier. The oxysilicate formation-enhancement layer also reduces the likelihood of the SFB metal from diffusing through a porous ILD, and provides a more reliable matrix for barrier formation.

Thus, an SFB formed using the techniques disclosed herein provides a reduced overall resistance and capacitance for interconnects and vias. In particular, an SFB formed according to the subject matter disclosed herein provides a Direct Current (DC) Resistance and Capacitance (RC) reduction of greater than 10% for interconnect lines and greater than 20% for vias in comparison to a conventional damascene process that uses deposited liners and non-self-formed barriers. Formation of a metal-oxysilicate tends to increase the capacitance associated with an interconnect or a via. By controlling processing conditions, such as annealing temperature and time and thickness of the oxysilicate formation-enhancement layer, the increase in capacitance caused by formation of a metal-oxysilicate can be reduced. The improvement in overall resistance by increasing copper cross-sectional thickness provided herein allows for interconnects having smaller aspect ratios so that the increase in capacitance due to formation of metal-oxysilicate is offset by a reduction in capacitance provided by improved (reduced) resistance and smaller aspect ratios.

Figure 1:
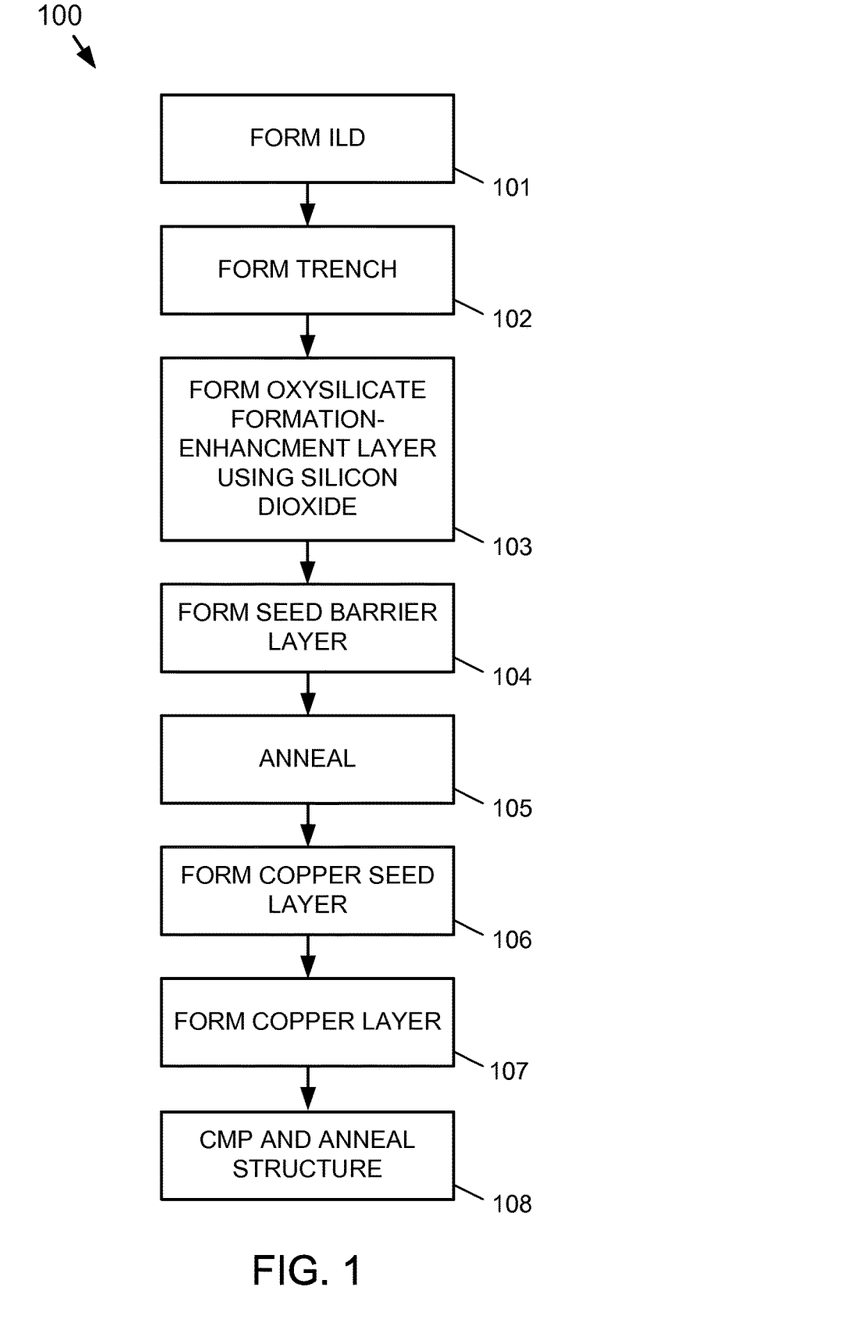
FIG. 1 depicts a flow diagram of a first exemplary embodiment of a process to form a self-formed metal-oxysilicate diffusion barrier for damascene metalization according to the subject matter disclosed herein.

FIG. 1 depicts a flow diagram of a first exemplary embodiment of a process 100 to form a self-formed metal-oxysilicate diffusion barrier for damascene metalization according to the subject matter disclosed herein. FIGS. 2A-2H respectively depict cross-sectional views of a first exemplary embodiment of a self-formed metal-oxysilicate diffusion barrier for damascene metalization at various stages of process 100 (FIG. 1) according to the subject matter disclosed herein. Although FIGS. 1 and 2A-2H relate to a self-formed metal-oxysilicate diffusion barrier for a conductive interconnect, it should be understood that a similar alternative process may be used for forming a metal-oxysilicate diffusion barrier for a conductive via.

At 101 in FIG. 1, a low-k Inter Layer Dielectric (ILD) 201 (FIG. 2A) is formed using a well-known deposition technique. Details of circuitry associated with ILD 201 have been omitted for clarity. In one exemplary embodiment, ILD 201 may be formed from a dielectric material that may comprise a well-known combination of silicon (Si), carbon (C), hydrogen (H), and/or oxygen (O). ILD 201 may also make use of porosity to lower the k value.

At 102, a trench 202 (FIG. 2B) for a conductive interconnect is formed in ILD 201 using a well-known etching technique. The cross-sectional size of the trench 202 depends on the type of structure being formed by the trench 202, i.e., whether the trench 202 is an interconnect line or a via, and the node, i.e., 7, 5 or 3 nm. In one exemplary embodiment in which trench 202 comprises an interconnect line, the cross-sectional size of the trench 202 ranges from about 5 nm$^2$ to about 50 nm$^2$.

At 103, an oxysilicate formation-enhancement layer 203 (FIG. 2C) is formed on the surface of ILD 201 and on the sides and bottom surface of trench 202 using a well-known conformal deposition technique, such as, but not limited to, Atomic Layer Deposition (ALD) or Chemical Vapor Deposition (CVD), or by using a well-known non-conformal deposition technique, such as, but not limited to, Physical Vapor Deposition (PVD). In one exemplary embodiment, the oxysilicate formation-enhancement layer 203 may be formed by depositing, for example, a layer of silicon dioxide ($SiO_2$) having a thickness of between about 1 nm to about 20 nm. In one exemplary embodiment, the oxysilicate formation-enhancement layer 203 may be a monolayer of silicon dioxide having a thickness of up to about 1 nm. In an alternative exemplary embodiment, the oxysilicate formation-enhancement layer 203 may comprise any other suitable dielectric material, such as silicon (Si), carbon (C), oxygen (O), a constituent component of ILD 201, or a combination thereof.

Figure 2A:
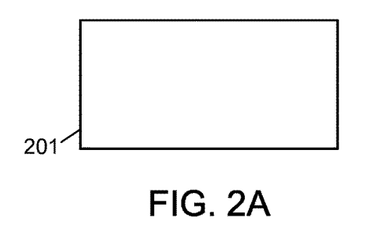
FIGS. 2A-2H respectively depict cross-sectional views of a first exemplary embodiment of a self-formed metal-oxysilicate diffusion barrier for damascene metalization at various stages of process (FIG. 1) according to the subject matter disclosed herein.
Figure 2B:
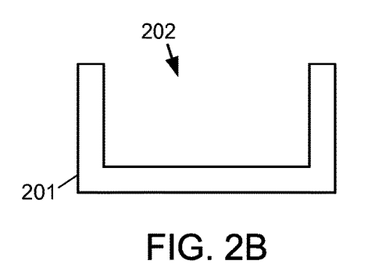
Figure 2C:
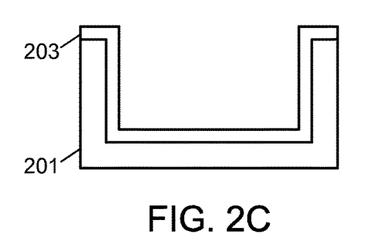

In one exemplary embodiment, oxysilicate formation-enhancement layer 203 may comprise a k value of between about 1.5 and about 3.5, and may comprise atoms that bond strongly to Mn, Cr and V, or other atoms that may diffuse into the ILD to form a metal oxysilicate diffusion barrier. The oxysilicate formation-enhancement layer 203 may promote formation of a metal-oxysilicate without compromising the structural integrity of the ILD and without modifying the atomic topology of the ILD in a manner that is detrimental to the overall k value of the ILD.

At 104, a barrier seed layer 204 (FIG. 2D) is deposited on the oxysilicate formation-enhancement layer 203 using a well-known conformal deposition technique. In one exemplary embodiment, the thickness of the barrier seed layer 204 is about one monolayer thick. In another exemplary embodiment, the thickness of barrier seed layer 204 ranges from about 0.5 nm to about 3 nm. In one exemplary embodiment, the barrier seed layer 204 comprises an elemental metal selected from a first group of elemental metals or one or more alloys formed from an elemental metal selected from the first group of elemental metals in combination with an elemental metal selected from a second group of elemental metals or one or more alloys formed from an elemental metal selected from the second group of elemental metals. According to the subject matter disclosed herein, the second group of elemental metals or alloys formed from the second group of elemental metals are (1) immiscible in copper or an alloy of copper; (2) have a diffusion constant that is greater than the self-diffusion of copper or an alloy of copper; (3) do not reduce silicon-oxygen (Si—O) bonds during oxysilicate formation; and (4) promotes adhesion of copper or an alloy of copper to the metal-oxysilicate barrier layer that will be formed.

Figure 2D:
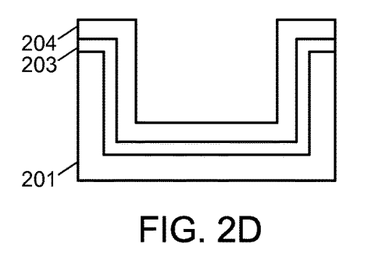

In another exemplary embodiment, the elemental metal selected from the first group of elemental metals is not used, and the barrier seed layer 204 comprises an elemental metal selected from the second group of elemental metals or one or more alloys formed from an elemental metal selected from the second group of elemental metals.

In one exemplary embodiment, the first group of elemental metals comprises copper (Cu), aluminum (Al), silver (Ag), gold (Au), cobalt (Co), tungsten (W), titanium (Ti), tantalum (Ta), and ruthenium (Ru). In one exemplary embodiment, the second group of elemental metals comprises manganese (Mn), chromium (Cr) and vanadium (V).

Manganese, chromium and vanadium are each immiscible in copper, and each have a diffusion constant that is greater than the self-diffusion of copper. Additionally, Mn, Cr and V do not reduce Si—O bonds during oxysilicate formation. Further, using Cr as either a standalone metal in forming the metal-oxysilicate or in conjunction with Mn and/or V, or alloys of Mn and/or V improves adhesion of copper to the underlying bather with proper control of annealing temperature and time so that an additional liner for copper adhesion is not needed and thereby increasing the amount of copper in the cross section of an interconnect or a via.

In one exemplary embodiment, the bather seed layer 204 comprises a form of $Cu_wM1_xM2_yM3_z$, in which $w+x+y+z=1$, and M1, M2 and M3 are selected from the group of elemental metals comprising Co, Mn, V and Cr. In another exemplary embodiment, the seed barrier layer 204 comprises a form of $M1_xM2_yM3_z$, in which $x+y+z=1$, and M1, M2 and M3 are selected from the group of elemental metals comprising Co, Mn, V, Cr, Ru and W.

Figure 2E:
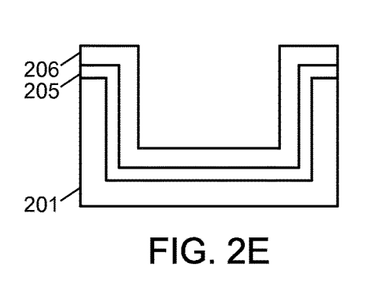

At 105, the structure of the ILD 201, the oxysilicate formation-enhancement layer 203 and the barrier seed layer 204 is annealed in a well-known manner. In one exemplary embodiment, the annealing time may range from about 30 minutes to about 16 hours, and the annealing temperature may range from about 100 C to about 1500 C. In another exemplary embodiment, the annealing time may range from about 30 minutes to about two hours, and the annealing temperature range may range from about 100 C and about 500 C. The metal atoms of barrier seed layer 204 diffuse into and bond with the atoms of the oxysilicate formation-enhancement layer 203 during annealing. Upon completion of annealing, two distinct layers remain, as depicted in FIG. 2E. The first layer comprises a metal-oxysilicate diffusion barrier layer 205 that has been formed by diffusion and reaction of metal atoms of the barrier seed layer 204 with the atoms of the oxysilicate formation-enhancement layer 203. The second layer comprises a residual layer 206 of copper that may contain a trace of the metals (i.e., Mn, Cr and/or V) of the seed barrier layer 204 that may have been left behind after the diffusion of metals from the barrier seed layer 204 into the oxysilicate formation-enhancement layer 203.

Figure 2F:
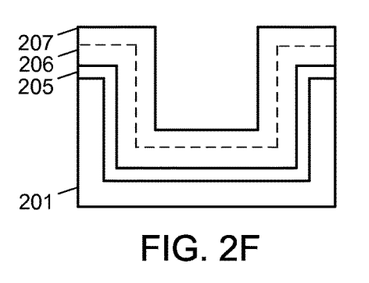

At 106, a copper seed layer 207 is deposited on the residual copper layer 206 using a well-known conformal deposition technique (FIG. 2F). In one exemplary embodiment, after the copper seed layer 207 has been deposited on the residual copper layer 206, the structure is annealed.

Figure 2G:
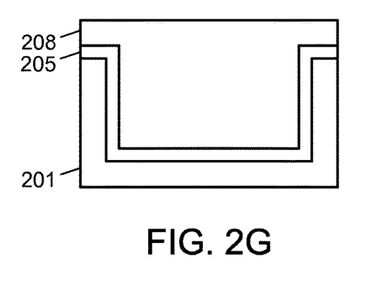

At 107, a copper layer 208 is deposited on the copper seed layer 207 using a well-known electrodeposition technique (FIG. 2G).

Figure 2H:
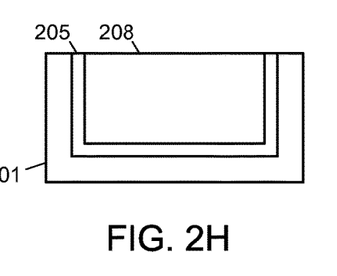

At 108, a well-known CMP technique is used to form the final interconnect structure (FIG. 2H). Further processing can be performed at this point, such as, but not limited to, capping of the structure so formed with additional layers of ILD that may or may not have the same k as the ILD 201.

Figure 3:
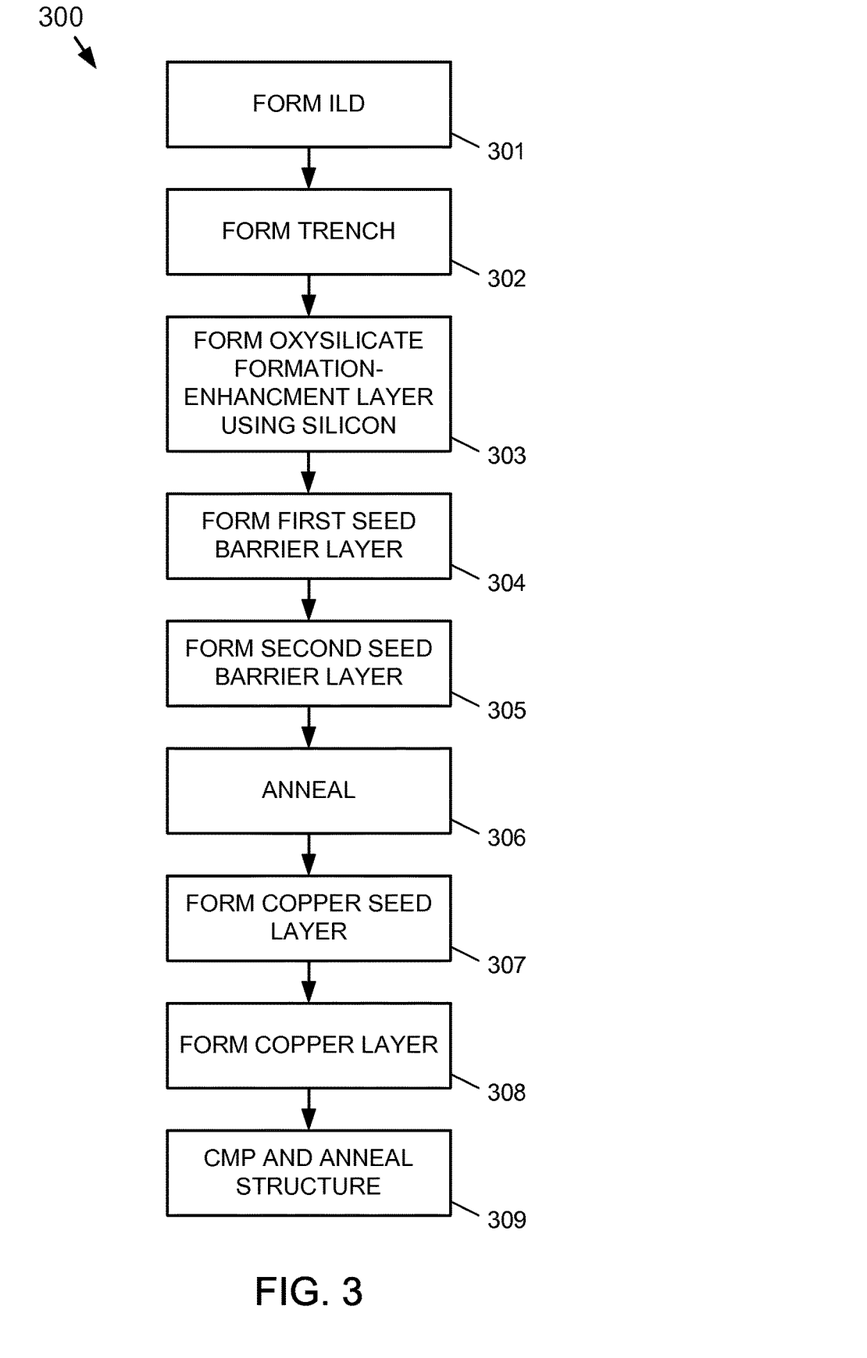
FIG. 3 depicts a flow diagram of a second exemplary embodiment of a process to form a self-formed metal-oxysilicate diffusion barrier for damascene metalization according to the subject matter disclosed herein.

FIG. 3 depicts a flow diagram of a second exemplary embodiment of a process 300 to form a self-formed metal-oxysilicate diffusion barrier for damascene metalization according to the subject matter disclosed herein. FIGS. 4A-4I respectively depict cross-sectional views of a second exemplary embodiment of a self-formed metal-oxysilicate diffusion barrier for damascene metalization at various stages of process 300 (FIG. 3) according to the subject matter disclosed herein. Although FIGS. 3 and 4A-4I relate to a self-formed metal-oxysilicate diffusion barrier for a conductive interconnect, it should be understood that a similar alternative process may be used for forming a metal-oxysilicate diffusion barrier for a conductive via.

At 301 in FIG. 3, a low-k Inter Layer Dielectric (ILD) 401 (FIG. 4A) is formed using a well-known deposition technique. Details of circuitry associated with ILD 401 have been omitted for clarity. In one exemplary embodiment, ILD 401 may be formed from a dielectric material that may comprise a well-known combination of silicon (Si), carbon (C), hydrogen (H), and/or oxygen (O). ILD 401 may also make use of porosity to lower the k value.

At 302, a trench 402 (FIG. 4B) for a conductive interconnect is formed in ILD 401 using a well-known etching technique. The cross-sectional size of the trench 402 depends on the type of structure being formed by the trench 402, i.e., whether the trench 402 is an interconnect line or a via, and the node, i.e., 7, 5 or 3 nm. In one exemplary embodiment in which trench 402 comprises an interconnect line, the cross-sectional size of the trench 402 ranges from about 5 $nm^2$ to about 50 $nm^2$.

At 303, an oxysilicate formation-enhancement layer 403 (FIG. 4C) is formed on the surface of ILD 401 and on the sides and bottom surface of trench 402 using a well-known conformal deposition technique, such as, but not limited to, ALD or CVD, or by a well-known non-conformal deposition technique, such as, but not limited to, PVD. The oxysilicate formation-enhancement layer 403 is formed by depositing, for example, a layer of silicon (Si) having a thickness of between about 1 nm to about 20 nm. In one exemplary embodiment, the oxysilicate formation-enhancement layer 403 may be a monolayer having a thickness of up to about 1 nm.

Figure 4A:
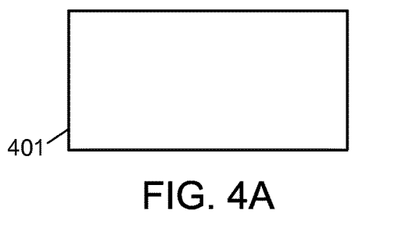
FIGS. 4A-4I respectively depict cross-sectional views of a second exemplary embodiment of a self-formed metal-oxysilicate diffusion barrier for damascene metalization at various stages of the process depicted in FIG. 3 according to the subject matter disclosed herein.
Figure 4B:
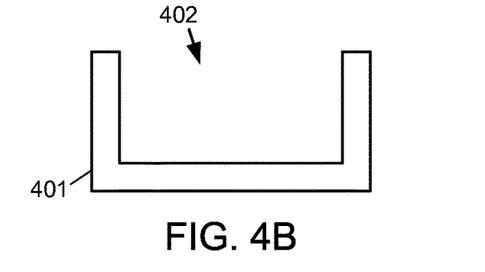
Figure 4C:
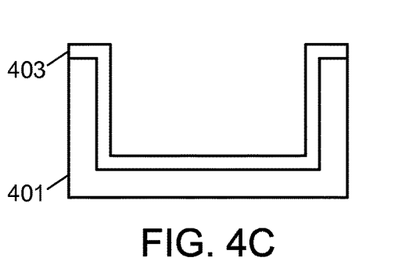

In one exemplary embodiment, oxysilicate formation-enhancement layer 403 may comprise a low-k value of between about 1.5 and about 3.5, and may comprise atoms that bond strongly to Mn, Cr and V, or other atoms that may diffuse into an ILD to form a metal oxysilicate diffusion barrier. The oxygen required to form a metal oxysilicate layer may be obtained by reaction of the silicon with the underlying ILD 401.

An alternative exemplary embodiment provides that at 302, the ILD is etched to form a trench 402 having a width that is relatively larger than a width described for the second exemplary embodiment, followed at 303 by deposition of the oxysilicate formation-enhancement layer 403 having a thickness of up to about 5 nm. Again, the cross-sectional size of the trench 402 depends on the type of structure being formed by the trench 402, i.e., whether the trench 402 is an interconnect line or a via, and the node, i.e., 7, 5 or 3 nm. In one exemplary embodiment in which the trench 402 comprises an interconnect line, the cross-sectional size of trench 402 could range from about 5 $nm^2$ to about 50 $nm^2$.

Returning to FIG. 3, at 304 a first barrier seed layer 404 (FIG. 4D) is deposited on oxysilicate formation-enhancement layer 403 using a well-known conformal deposition technique. In one exemplary embodiment, the thickness of the barrier seed layer 404 is about one monolayer thick. In another exemplary embodiment, the thickness of barrier seed layer 404 ranges from about 0.5 nm to about 3 nm. In one exemplary embodiment, the first barrier seed layer 404 does not use an elemental metal or alloy selected from the first group of elemental metals; consequently, the barrier seed layer 404 comprises an elemental metal selected from the second group of elemental metals or one or more alloys formed from an elemental metal selected from the second group of elemental metals. As before, the second group of elemental metals or alloys formed from elemental metals selected from the second group of elemental metals are (1) immiscible in copper or an alloy of copper; (2) have a diffusion constant that is greater than the self-diffusion of copper or an alloy of copper; (3) do not reduce silicon-oxygen (Si—O) bonds during oxysilicate formation; and (4) promotes adhesion of copper or an alloy of copper to the metal-oxysilicate barrier layer that will be formed.

Figure 4D:
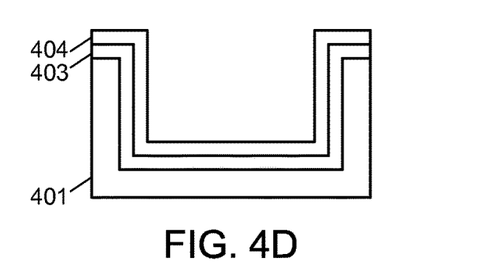

In one exemplary embodiment, the first barrier seed layer 404 comprises a form of $M1_xM2_y$, in which $x+y=1$ and elemental metals M1 and M2 are selected from the group comprising Co, Mn, V and Ru.

At 305, a second barrier seed layer 405 (FIG. 4E) is deposited on the first barrier seed layer 404 using a well-known conformal deposition technique. In one exemplary embodiment, the second barrier seed layer 405 comprises an elemental metal selected from a first group of elemental metals or one or more alloys formed from an elemental metal selected from the first group of elemental metals in combination with an elemental metal selected from a second group of elemental metals or one or more alloys formed from an elemental metal selected from the second group of elemental metals. In one exemplary embodiment, the first group of metals comprises copper (Cu), aluminum (Al), silver (Ag), gold (Au), cobalt (Co), tungsten (W), titanium (Ti), tantalum (Ta), and ruthenium (Ru). In one exemplary embodiment, the second barrier seed layer 405 comprises a form of $Cu_xM3_y$, in which x+y=1 and M3 comprises Cr. In one exemplary embodiment, the thickness of the bather seed layer 405 is about one monolayer thick. In another exemplary embodiment, the thickness of barrier seed layer 405 ranges from about 0.5 nm to about 3 nm.

Figure 4E:
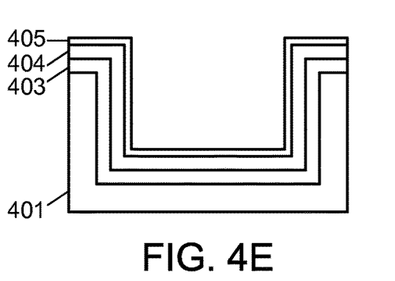

In one exemplary embodiment, one or more well-known directional deposition techniques are used to form the thickness of first barrier seed layer 404 to be thicker than the thickness of the second barrier seed layer 405 on the sidewalls, and to form the thickness of the first barrier seed layer 404 to be thinner than the thickness of the second barrier seed layer 405 on the bottom of trench 402 so that the copper conductive material deposited later in process 300 wets significantly more on the bottom of trench 402 than on the sidewalls of trench 402. In another exemplary embodiment, one or more well-known directional deposition techniques are used to form the thickness of first barrier seed layer to be thinner than the thickness of the second barrier seed layer 405 on the side walls, and to form the thickness of the first barrier seed layer 404 to be thicker than the thickness of the second barrier seed layer 405 on the bottom of trench 402 so that the copper conductive materials deposited later in process 300 wets significantly more on the sidewalls of trench 402 than on the bottom of trench 402. In still another exemplary embodiment, a PVD, which typically fills a trench bottom more than the trench sidewalls, could be used, followed by an isotropic etch.

Figure 4F:
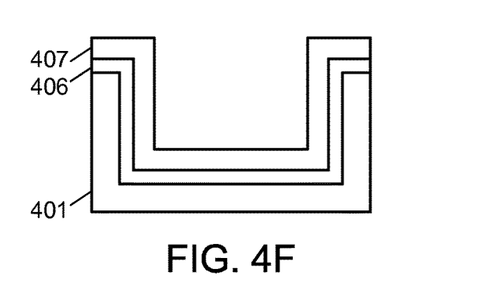

At 306, the structure of the ILD 401, the oxysilicate formation-enhancement layer 403 and the barrier seed layer 404 is annealed in a well-known manner. In one exemplary embodiment, the annealing time may range from about 30 minutes to about 16 hours, and the annealing temperature may range from about 100 C to about 1500 C. In another exemplary embodiment, the annealing time may range from about 30 minutes to about two hours, and the annealing temperature may range from about 100 C to about 500 C. The resulting structure after annealing is depicted in FIG. 4F. The metal atoms of barrier seed layers 404 and 405 diffuse into the oxysilicate formation-enhancement layer 403 during annealing and the metal atoms bond to the atoms of the oxysilicate formation-enhancement layer 403. Upon completion of annealing, two distinct layers remain, as depicted in FIG. 4F. The first layer comprises a metal-oxysilicate diffusion barrier layer 406 formed by diffusion and reaction of the metal in the barrier seed layers 404 and 405. The second layer comprises a residual layer 407 of copper that may contain a trace of Mn, Cr and/or V that may have been left behind after the diffusion of metal from the barrier seed layers 404 and 405 into the oxysilicate formation-enhancement layer 403.

Figure 4G:
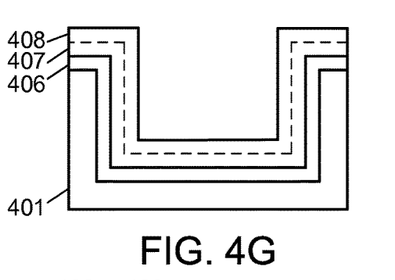

At 308, a copper seed layer 408 is deposited on the residual copper layer 407 using a well-known conformal deposition technique (FIG. 4G). In one exemplary embodiment, after the copper seed layer 408 has been deposited on the residual copper layer 407, the structure is annealed.

Figure 4H:
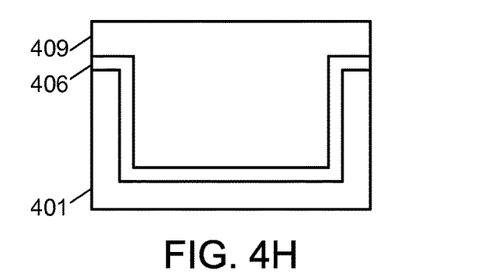

At 309, a copper layer 409 is deposited on the copper seed layer 408 using a well-known electrodeposition technique (FIG. 4H).

Figure 4I:
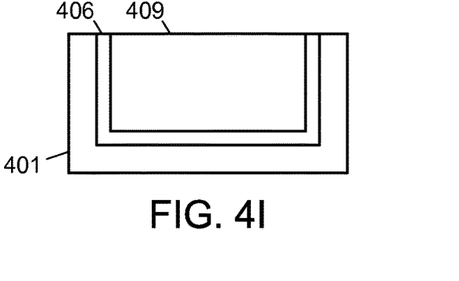

At 310, a well-known CMP technique is used to for the final interconnect structure (FIG. 4I). Further processing can be performed at this point, such as, but not limited to, capping of the structure so formed with additional layers of ILD that may or may not have the same k as the ILD 401.

Figure 5:
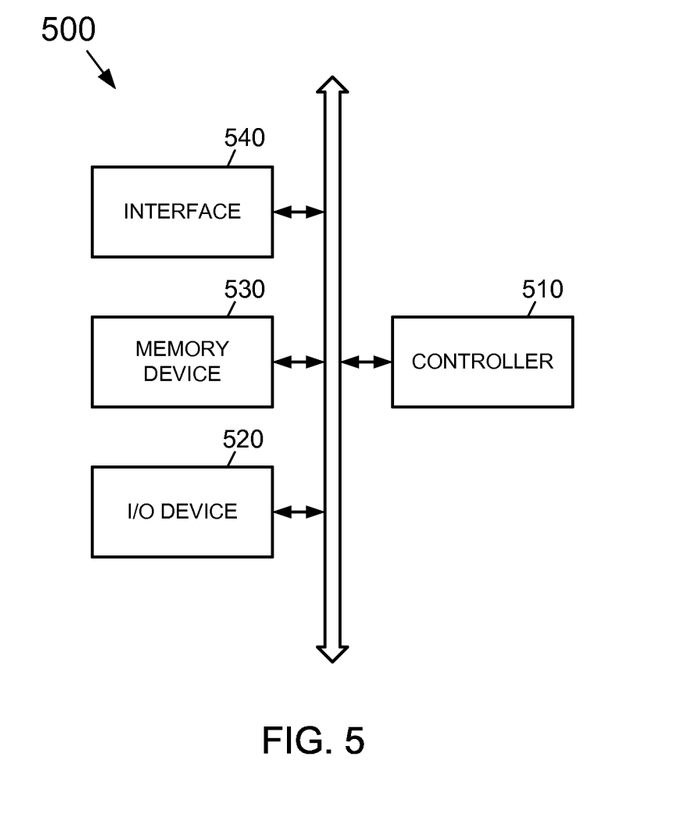
FIG. 5 depicts an electronic device that comprises one or more integrated circuits (chips) comprising one or more interconnects and/or vias that have been formed in an ILD utilizing an oxysilicate formation-enhancement layer according to exemplary embodiments disclosed herein.

FIG. 5 depicts an electronic device 500 that comprises one or more integrated circuits (chips) comprising one or more interconnects and/or vias that have been formed in an ILD utilizing an oxysilicate formation-enhancement layer according to exemplary embodiments disclosed herein. Electronic device 500 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 500 may comprise a controller 510, an input/output device 520 such as, but not limited to, a keypad, a keyboard, a display, or a touch-screen display, a memory 530, and a wireless interface 540 that are coupled to each other through a bus 550. The controller 510 may comprise, for example, at least one microprocessor, at least one digital signal process, at least one microcontroller, or the like. The memory 530 may be configured to store a command code to be used by the controller 510 or a user data. Electronic device 500 and the various system components comprising electronic device 500 may comprise one or more integrated circuits (chips) comprising interconnects and/or vias that have been formed in an ILD utilizing an oxysilicate formation-enhancement layer according to exemplary embodiments disclosed herein. The electronic device 500 may use a wireless interface 540 configured to transmit data to or receive data from a wireless communication network using a RF signal. The wireless interface 540 may include, for example, an antenna, a wireless transceiver and so on. The electronic system 500 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 6:
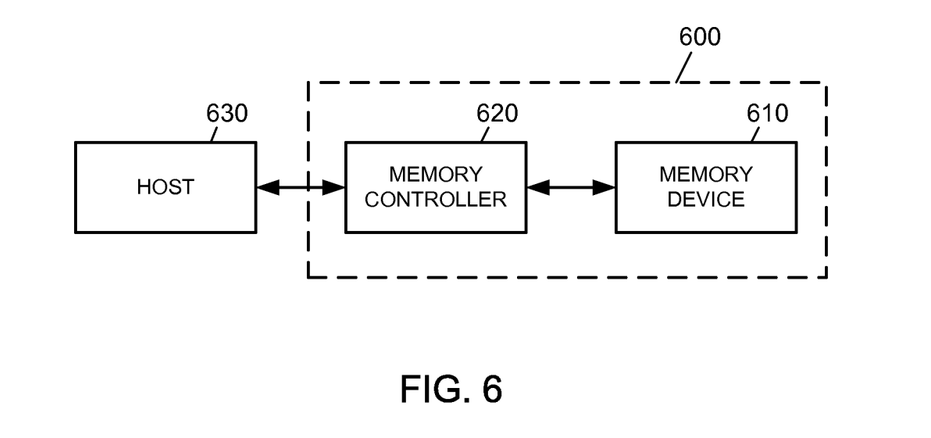
FIG. 6 depicts a memory system that may comprise one or more integrated circuits (chips) comprising interconnects and/or vias that have been formed in an ILD utilizing an oxysilicate formation-enhancement layer according to example embodiments disclosed herein.

FIG. 6 depicts a memory system 600 that may comprise one or more integrated circuits (chips) comprising interconnects and/or vias that have been formed in an ILD utilizing an oxysilicate formation-enhancement layer according to example embodiments disclosed herein. The memory system 600 may comprise a memory device 610 for storing large amounts of data and a memory controller 620. The memory controller 620 controls the memory device 610 to read data stored in the memory device 610 or to write data into the memory device 610 in response to a read/write request of a host 630. The memory controller 620 may include an address-mapping table for mapping an address provided from the host 630 (e.g., a mobile device or a computer system) into a physical address of the memory device 610. The memory device 610 may comprise one or more semiconductor devices comprising one or more interconnects and/or vias that have been formed in an ILD utilizing an oxysilicate formation-enhancement layer according to exemplary embodiments disclosed herein.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the subject matter disclosed herein. Accordingly, all such modifications are intended to be included within the scope of the appended claims.

What is claimed is:

1. A method to form a metal-oxysilicate diffusion barrier, the method comprising:
    forming at least one trench structure in an Inter Layer Dielectric (ILD) material, the at least one trench structure comprising at least one sidewall surface and a bottom surface;
    forming an oxysilicate formation-enhancement layer on the at least one sidewall surface and the bottom surface of the at least one trench structure, the oxysilicate formation-enhancement layer comprising silicon;
    forming a barrier seed layer on the oxysilicate formation-enhancement layer, the barrier seed layer comprising an elemental metal selected from a first group of elemental metals or one or more alloys formed from an elemental metal selected from the first group of elemental metals, and the first group of elemental metals comprising manganese, chromium and vanadium; and
    annealing the at least one trench structure, the oxysilicate formation-enhancement layer and the barrier seed layer to form a metal-oxysilicate diffusion barrier layer,
    wherein forming a barrier seed layer on the oxysilicate formation-enhancement layer comprises:
    forming a first barrier seed layer comprising a form of $M1_xM2_y$, in which $x+y=1$, and elemental metals M1 and M2 are selected from the group comprising manganese and vanadium; and
    forming a second barrier seed layer comprising a form of $Cu_xM3_y$, in which $x+y=1$, and M3 comprises chromium, wherein the second barrier seed layer includes at least a trace of chromium.

2. The method according to claim 1, wherein the oxysilicate formation-enhancement layer comprises silicon dioxide.

3. The method according to claim 2, wherein an elemental metal in the first group of elemental metals is immiscible in copper or an alloy of copper, has a diffusion constant that is greater than a self-diffusion of copper or an alloy of copper; does not reducing silicon-oxygen bonds during oxysilicate formation; and promotes adhesion of copper or an alloy of copper to the metal-oxysilicate barrier diffusion layer.

4. A method to form a self-formed diffusion barrier, the method comprising:
    forming at least one trench structure in an Inter Layer Dielectric (ILD) material, the at least one trench structure comprising at least one sidewall surface and a bottom surface;
    forming a self-formed diffusion barrier (SFB) on the at least one sidewall and the bottom surface of the at least one trench by:
        forming an oxysilicate formation-enhancement layer on the at least one sidewall surface and the bottom surface of the at least one trench structure, the oxysilicate formation-enhancement layer comprises silicon;
        forming a barrier seed layer on the oxysilicate formation-enhancement layer, the barrier seed layer comprising an elemental metal selected from a first group of elemental metals or one or more alloys formed from an elemental metal selected from the first group of elemental metals, and the first group of elemental metals comprising manganese, chromium and vanadium; and
        annealing the at least one trench structure, the oxysilicate formation-enhancement layer and the barrier seed layer to form the SFB;
    forming a seed layer of a conductive material on the SFB; and
    forming a layer of the conductive material on the seed layer of the conductive material by electrodeposition,
    wherein forming a barrier seed layer on the oxysilicate formation-enhancement layer comprises:
    forming a first barrier seed layer comprising a form of $M1_xM2_y$, in which $x+y=1$, and elemental metals M1 and M2 are selected from the group comprising manganese and vanadium; and
    forming a second barrier seed layer comprising a form of $Cu_xM3_y$, in which $x+y=1$, and M3 comprises chromium, wherein the second barrier seed layer includes at least a trace of chromium.

5. The method according to claim 4, wherein an elemental metal in the second group of elemental metals is immiscible in copper or an alloy of copper, has a diffusion constant that is greater than a self-diffusion of copper or an alloy of copper; does not reducing silicon-oxygen bonds during oxysilicate formation; and promotes adhesion of copper or an alloy of copper to the metal-oxysilicate barrier diffusion layer, and
    wherein the oxysilicate formation-enhancement layer comprises silicon dioxide.

6. A method to form a metal-oxysilicate diffusion barrier, the method comprising:
    forming at least one trench structure in an Inter Layer Dielectric (ILD) material, the at least one trench structure comprising at least one sidewall surface and a bottom surface;
    forming an oxysilicate formation-enhancement layer on the at least one sidewall surface and the bottom surface of the at least one trench structure, the oxysilicate formation-enhancement layer comprises silicon;
    forming a barrier seed layer on the oxysilicate formation-enhancement layer, the barrier seed layer comprising an elemental metal selected from a first group of elemental metals or one or more alloys formed from an elemental metal selected from the first group of elemental metals, an elemental metal in the first group of elemental metals being immiscible in copper or an alloy of copper, having a diffusion constant that is greater than a self-diffusion of copper or an alloy of copper, not reducing silicon-oxygen bonds during oxysilicate formation, and promoting adhesion of copper or an alloy of copper to the metal-oxysilicate barrier diffusion layer, and the first group of elemental metals comprising manganese, chromium and vanadium; and annealing the at least one trench structure, the oxysilicate formation-enhancement layer and the barrier seed layer to form a metal-oxysilicate diffusion barrier layer, wherein forming a barrier seed layer on the oxysilicate formation-enhancement layer comprises:

forming a first barrier seed layer comprising a form of $M1_xM2_y$, in which x+y=1, and elemental metals M1 and M2 are selected from the group comprising manganese and vanadium; and forming a second barrier seed layer comprising a form of $Cu_xM3_y$, in which x+y=1, and M3 comprises chromium, wherein the second barrier seed layer includes at least a trace of chromium.

* * * * *